United States Patent [19]

Yamazaki et al.

[11] Patent Number: 4,595,453

[45] Date of Patent: Jun. 17, 1986

[54] METHOD FOR ETCHING A SEMICONDUCTOR SUBSTRATE OR LAYER

[75] Inventors: Shunpei Yamazaki; Toshiji Hamatani, both of Tokyo, Japan

[73] Assignee: Semiconductor Energy Laboratory Co., Ltd., Tokyo, Japan

[21] Appl. No.: 653,859

[22] Filed: Sep. 24, 1984

[30] Foreign Application Priority Data

Sep. 22, 1983 [JP] Japan .................................. 58-175686

[51] Int. Cl.⁴ ...................... H01L 21/306; B44C 1/22; C03C 15/00; C03C 25/06
[52] U.S. Cl. ................................... 156/643; 156/646; 156/657; 156/659.1; 156/662; 204/192 E; 252/79.1
[58] Field of Search ............... 156/643, 646, 653, 657, 156/659.1, 662, 345; 252/79.1; 204/164, 192 E, 192 EC, 298; 427/38, 39; 430/313, 317, 318

[56] References Cited

U.S. PATENT DOCUMENTS 3,615,956 10/1971 Irving et al. ..................... 156/646 X

*Primary Examiner*—William A. Powell
*Attorney, Agent, or Firm*—Gerald J. Ferguson, Jr.

[57] ABSTRACT

A semiconductor substrate or layer formed principally of silicon or silicon carbide is selectively or nonselectively etched by using a hydrogen fluoride gas plasma as a reactive gas plasma.

In the case of nonselectively etching the semiconductor substrate or layer, a mask layer of silicon oxide, silicon nitride, metal such as aluminum, chrominum, nickel, cobalt, tantalum, tungsten or molybdenum, or photoresist is preformed into a required pattern on the semiconductor substrate or layer.

6 Claims, 3 Drawing Figures

METHOD FOR ETCHING A SEMICONDUCTOR SUBSTRATE OR LAYER

BACKGROUND OF THE INVENTION

1. Field of the Invention

The present invention relates to a method for selectively or nonselectively etching a semiconductor substrate or layer constituted principally of silicon or silicon carbide, and more particularly to a method for etching such a semiconductor substrate or layer through the use of a reactive gas plasma.

2. Description of the Prior Art

Heretofore, there have been proposed a wide variety of semiconductor devices employing a semiconductor substrate or layer constituted principally of silicon or silicon carbide. Such semiconductor devices are usually fabricated by a manufacturing method including a step of selectively or nonselectively etching the semiconductor substrate or layer.

Methods that have been proposed for etching the semiconductor substrate or layer are a dry etching method employing a reactive gas plasma and a wet etching method employing a reactive liquid. Recently the dry etching method has been used widely because it is superior to the wet etching method in precision and in minuteness.

The conventional dry etching process usually employs, as the reactive gas plasma, a plasma of a gas containing carbon and a halogen, such as $CF_4$, $CHF_3$, $CF_3Br$ or $CCl_4$ gas, or a plasma of a gas mixture of such a gas containing carbon and a halogen and a hydrogen, nitrogen or oxygen gas.

However, in the case of etching the semiconductor substrate or layer formed principally of silicon or silicon carbide by the dry etching process using the plasma of a gas containing carbon and a halogen, the carbon, its compound with the halogen and the halogen enter into the semiconductor substrate or layer. As a result of this, the composition of the semiconductor substrate or layer undergoes variations, preventing the etching thereof. Furthermore, the characteristic of the substrate or layer is degraded, and in some cases, it is insulated, in particular, by the carbon. Sometimes recombination centers are created by virtue of the halogen (except fluorine) in the semiconductor substrate or layer. When using a plasma of the gas mixture of the gas containing carbon and a halogen and oxygen gas, the abovesaid difficulties are encountered, and at the same time, oxygen enters into the semiconductor substrate or layer to insulate it.

When using a plasma of the gas containing carbon and a halogen or a plasma of the abovesaid gas mixture incuding such a gas, the carbon is left as a residue on the surface of the semiconductor substrate or layer. This carbon residue hinders the etching of the semiconductor substrate or layer and contaminates its surface.

The abovesaid reactive gas plasma is usually created from the reactive gas by applying thereto a high-frequency power. In the case of using, as the reactive gas plasma, a plasma of the abovementioned gas containing carbon and a halogen, or the aforesaid gas mixture containing it, the etching rate of the semiconductor substrate or layer is low unless the high-frequency power applied to the reactive gas for producing its plasma is sufficiently high or unless the semiconductor substrate or layer is heated by an electric heater to sufficiently high temperatures. Accordingly, the etching inevitably consumes much power or much time.

For selectively etching the semiconductor substrate or layer into a required pattern through using the reactive gas plasma, it is customary to use a mask layer formed on the semiconductor substrate or layer. Conventionally, the mask layer is formed of silicon nitride, silicon oxide, Al, Cr, Ni, Co, Ta, W, Mo or like metal, or photoresist, in the case of using, as the reactive gas plasma, a plasma of the gas containing carbon and a halogen or a plasma of the gas mixture containing it. However, the etching rate of the mask layer is lower than the etching rate of the semiconductor substrate or layer by the abovesaid gas plasma or gas mixture plasma, but the mask layer is inevitably etched at a relatively high rate. That is to say, the ratio between the etching rate of the semiconductor substrate or layer and etching rate of the mask layer is relatively small. This leads to the defects that the mask layer must be formed thick and that the semiconductor substrate or layer cannot be etched into a required pattern with high precision.

The etching of the semiconductor substrate or layer through the use of the reactive gas plasma is usually performed by placing the semiconductor substrate or layer in a reaction chamber, forming the plasma from the reactive gas and passing the plasma over the surface of the semiconductor substrate or layer by the use of an exhaust pump connected to the reaction chamber from the outside. In this case, when the gas containing carbon and a halogen (except fluorine) is used, the exhaust pump is attacked by a halogen (except fluorine) gas and a compound gas of the carbon and the halogen (except fluorine). Therefore, the conventional etching process utilizing a plasma of the gas containing carbon and a halogen shortens the lifetime of the exhaust pump.

SUMMARY OF THE INVENTION

It is therefore an object of the present invention to provide a novel semiconductor etching method which is free from the abovesaid defects of the prior art and permits etching of a semiconductor substrate or layer of silicon or silicon carbide through the use of a reactive gas plasma.

The semiconductor etchig method of the present invention employs a plasma of hydrogen fluoride (HF) gas as the reactive gas plasma for selectively or nonselectively etching the semiconductor substrate or layer.

In the case of etching the semiconductor substrate or layer by using the hydrogen fluoride gas plasma according to the present invention, hydrogen (H) and fluorine (F) forming the hydrogen fluoride gas are difficult to enter into the semiconductor substrate or layer. Even if they enter, their amounts are small and they do not hinder the etching of the substrate or layer and hardly degrade the characteristic of the semiconductor substrate or layer. They rather serve as a dangling bond neutralizer which neutralizes dangling bonds in the semiconductor substrate or layer, improving its characteristic. This means that the present invention is of particular utility when employed in the case where the semiconductor substrate or layer is formed of non-single-crystal silicon or silicon carbide, that is, where the semiconductor substrate or layer is formed of amorphous, semi-amorphous, polycrystalline or microcrystalline silicon or silicon carbide. The reason for this is that when the semiconductor substrate or layer is formed of non-single-crystalline silicon or silicon carbide, it has many dangling bonds unless it is doped with a dangling bond neutralizer and the dangling bonds are neutralized by the hydrogen and the fluorine.

According to the semiconductor etching method of the present invention, since the hydrogen and the fluorine forming the hydrogen fluoride gas hardly remain on the surface of the semiconductor substrate or layer, etching can be smoothly carried out. Even if they remain on the semiconductor substrate or layer surface after etching, they can easily be removed afterwards.

In the case of etching the semiconductor substrate or layer according to the present invention, the hydrogen fluoride gas plasma is produced by applying a high-frequency power to the hydrogen fluoride gas in the same manner as in the past. However, according to the present invention, even if the high-frequency power is far lower than in the case of the prior art method, or even if the temperature of the semiconductor substrate or layer is lower than in the case of the prior art method, the etching rate of the semiconductor substrate or layer is high. Therefore, according to the present invention, the etching of the semiconductor substrate or layer can be effected with far smaller power consumption and in a shorter time than in the past.

Moreover, according to the semiconductor etching method of the present invention, the semiconductor substrate or layer is selectively etched away by using the hydrogen fluoride gas plasma through a mask layer formed on the semiconductor substrate or layer in the same manner as described above in connection with the prior art method. In this case, even if the mask layer is inevitably etched by the hydrogen floride gas plasma, its etching rate is far lower than that by the plasma of the gas containing carbon and halogen, or the plasma of the gas mixture containing the gas. In other words, the difference between the etching rate of the semiconductor substrate or layer and the etching rate of the mask layer is far greater than in the case of the conventional method. Consequently, even if the mask layer is not formed to a large thickness on the semiconductor substrate or layer, it is possible to etch the semiconductor substrate or layer into a more accurate and minute pattern.

Besides, according to the semiconductor etching method of the present invention, the etching of the semiconductor substrate or layer is performed by passing the reactive gas plasma over the semiconductor substrate or layer in a reaction chamber through the use of an exhaust pump connected thereto from the outside in the same manner as in the case of the prior art method. In this case, since the reactive gas plasma is a hydrogen fluoride gas plasma, hydrogen fluoride gas and gases of the hydrogen and fluorine constituting the hydrogen fluoride pass through the exhaust pump, but the pump is scarecely attacked by these gases. Accordingly, the semiconductor etching method of the present invention is free from the detect of reducing the service life of the exhaust pump.

Other objects, features and advantages of the present invention will become more apparent from the following detailed description taken in conjunction with the accompanying drawings.

DESCRIPTION OF THE PREFERRED EMBODIMENTS

EXAMPLE 1

Figure 1:
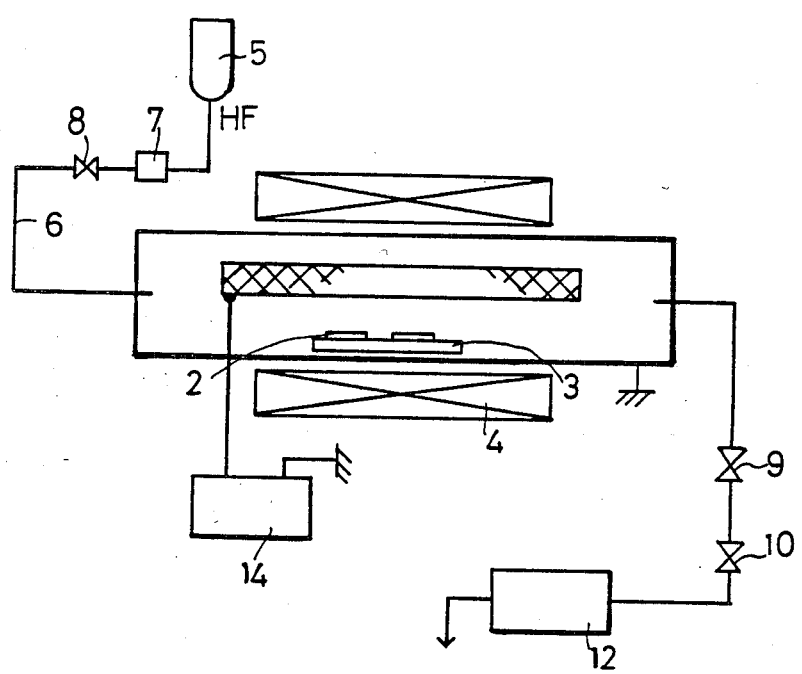
FIG. 1 is a schematic diagram illustrating an embodiment of the semiconductor etching method of the present invention and an embodiment of a plasma etching apparatus thereof.

A description will be given, with reference to FIG. 1, of a first embodiment of the semiconductor etching method of the present invention.

At first, a substrate 2 to be etched is placed, by means of a holder 3 in a reaction chamber 1 as of quartz.

An example of the substrate 2 is a semiconductor substrate formed of silicon (Si) or silicon carbide ($Si_xC_{1-x}$ (where $0<x<1$)). Another example of the substrate 2 has such a structure that a semiconductor layer of silicon or silicon carbide, which is to be etched, is formed on the abovesaid semiconductor substrate. Still another example of the substrate 2 has such a structure that the semiconductor layer of silicon or silicon carbide, which is to be etched, is formed on a substrate body of a semiconductor, insulator or metal.

The substrate 2 and accordingly, the semiconductor substrate or layer of silicon or silicon carbide, placed in the reaction chamber 1 is held at t temperature ranging from room temperature to 300° C. When the semiconductor substrate or layer is held at a temperature higher than room temperature, heating means 4 such as a coil heater, provided around the reaction chamber 1 is employed.

Then, by activating an exhaust pump 12 connected to the reaction chamber 1 at one end thereof via a pipe 9 and valves 10 and 11 and opening the valves 10 and 11, the reaction chamber 1 is evacuated so that the pressure therein is lower than $10^{-4}$ Torr. In this case, high-frequency (for example, 13.56 MHz) power (RF) from a high-frequency power source 14 is applied to the atmosphere in the reaction chamber 1 through an electrode 13 as by metallic mesh disposed therein. In this way, oxygen, oxides and like impurities are removed from the reaction chamber 1.

Next, high purity (such as more than 99%) hydrogen fluoride (HF) gas, which is a reactive gas from a gas source 5, is introduced via a pipe 6, flowmeter 7 and a valve 8 into the reaction chamber 1 on the opposite side from the exhaust pump 12 at a flow rate of, for example, 100 cc/min. In this case, the exhaust pump 12 is held in operation and the opening of the valves 9 and 10 is adjusted so that the pressure in the reaction chamber 1 is retained in the range of 0.05 to 3 Torr, for instance, 0.5 Torr. The high-frequency power (RF) from the high-frequency power source 14 is continuously applied to the atmosphere in the reaction chamber 1.

In such a case, the hydrogen fluoride gas introduced into the reaction chamber 1 is excited by the high-frequency power (RF) to produce a hydrogen fluoride gas plasma, which passes over the surface of the substrate 2. By this, the substrate 2 and consequently the semiconductor substrate or layer is etched.

Figure 2:
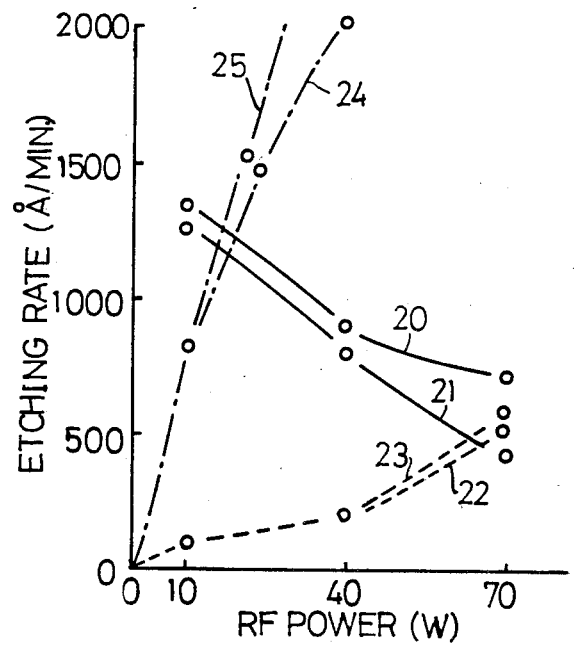
FIG. 2 is a graph showing the relationship between high-frequency power which is applied to a reactive gas for generating therefrom a reactive gas plasma and the etching rate of a semiconductor substrate or layer.
Figure 3:
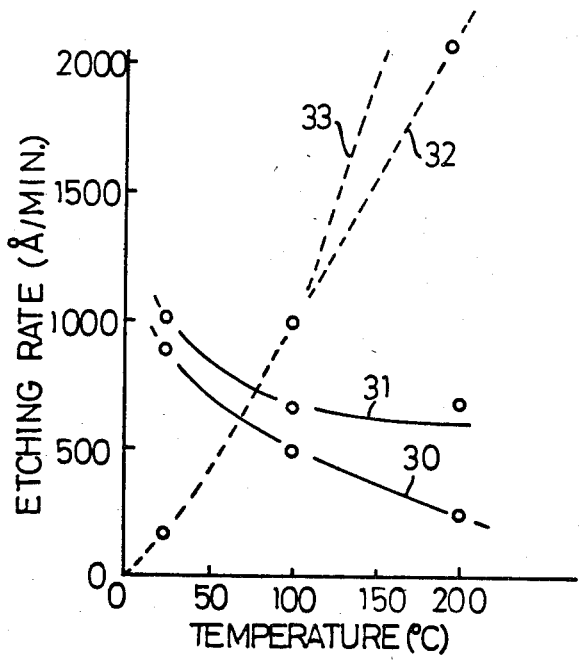
FIG. 3 is a graph showing the relationship between the temperature of the semiconductor substrate or layer and its etching rate by the reactive gas plasma.

The etching rate (Å/min) of the semiconductor substrate or layer depends upon the magnitude (Watt) of the high-frequency power (RF) which is applied to the hydrogen fluoride gas introduced into the reaction chamber 1 and the temperature (°C.) of the semiconductor substrate or layer. In FIG. 2, the full lines 20 and 21 show the relationships between the magnitude (Watt) of the high-frequency power (RF) and the etching rate (Å/min) of the semiconductor substrate or layer in the cases where the semiconductor substrate or layer is formed of non-single-crystal silicon with its surface by a crystal plane (100) and where it is formed of amorphous silicon, respectively. In FIG. 3, the full lines 30 and 31 show the relationships between the temperature (°C.) of the semiconductor substrate or layer and its etching rate (Å/min) in the cases where the semiconductor substrate or layer is formed of non-single-crystal silicon with its surface by a crystal plane (100) and where it is formed of amorphous silicon, respectively.

In FIG. 2, there are shown, for comparison, by the broken lines 22 (in the case where the semiconductor substrate or layer is formed of non-single-crystal silicon with its surface by a crystal plane (100)) and 23 (in the case the semiconductor substrate or layer is formed of amorphous silicon), and the chain lines 24 (in the case where the semiconductor substrate or layer is formed of non-single-crystal siicon with its surface by a crystal plane (100)), and 25 (in the case the semiconductor substrate or layer is formed of amorphous silicon) similar relationships in the case of using, as the reactive gas plasma, the $CF_4$ gas plasma and a plasma of a gas mixture of the $CF_4$ gas and oxygen, respectively.

In FIG. 3, there are also shown, for comparison, by the broken lines 32 (in the case where the semiconductor substrate or layer is formed of non-single-crystal silicon with its surface by a crystal plane (100)) and 33 (in the case the semiconductor substrate or layer is formed of amorphous silicon), the similar relationships in the case of using, as the reactive gas plasma, a $CF_4$ gas plasma employed in the past.

It will be seen from FIGS. 2 and 3 that according to the first embodiment of the present invention, when the semiconductor substrate or layer is formed of silicon with its surface by a crystal plane (100) and amorphous silicon, even if the magnitude of the high-frequency power (RF) for generating the reactive gas plasma is far smaller than in the case of the prior art method and even if the temperature of the semiconductor substrate or layer is far lower than in the case of the conventional method, the semiconductor substrate or layer can be etched at a rate far higher than that obtainable with the conventional method. This feature can be similarly obtained in the case where the semiconductor substrate or layer is formed of silicon with its surface by a crystal plane (111), non-single-crystal silicon such as semi-amorphous, polycrystalline or microcrystalline non-single-cyrstal silicon, or non-single-crystal silicon carbide.

The features and advantages of the first embodiments of the present invention are evident from the description given previously in the "Summary of the Invention", and hence no detailed description will be repeated.

EXAMPLE 2

Next, a description will be given of a second embodiment of the present invention.

At first, a known mask layer of silicon oxide ($SiO_2$), silicon nitride ($SiN_4$), metal such as aluminum (Al), chromium (Cr), nickel (Ni), cobalt (Co), tantalum (Ta), tungsten (W) or molybdenum (Mo), or photoresist, is formed by a known method in a required pattern on the substrate 2 as described previously in connection with the first embodiment.

Next, the substrate 2 having formed thereon the mask layer is placed in the reaction chamber 1 described previously with regard to FIG. 1 in the same manner as in the first embodiment.

Thereafter, the reaction chamber 1 is evacuated while holding the substrate 2 at a temperature in the range of room temperature to 300° C. and applying the high-frequency power (RF) in the reaction chamber 1 in the same manner as in the first embodiment.

Next, the hydrogen fluoride (HF) gas is introduced into the reaction chamber 1, wherein the hydrogen fluoride gas plasma is generated, by the high-frequency power, from the hydrogen fluoride gas and passes over the surface of the substrate 2.

As a result of this, the region of the substrate and accordingly the semiconductor substrate or layer which is not covered with the mask layer is etched in the same manner as in the first embodiment. It has been ascertained experimentally that in the case where the semiconductor substrate or layer is formed of silicon and the mask layer of silicon oxide, the former is etched 5$\mu$ deep in about 60 minutes and the latter to a depth as small as 300 Å.

While the foregoing embodiments have been described in connection with the case where the semiconductor substrate or layer is formed of silicon or silicon carbide, it is seen that the abovedescribed excellent features of the present invention can be obtained so long as the semiconductor substrate or layer is formed principally of silicon or silicon carbide and even if it contains an impurity which imparts a conductivity type (N or P conductivity type).

It will be apparent that many modifications and variations may be effected without departing from the scope of the novel concepts of the present invention.

What is claimed is:

1. A method for etching a semiconductor substrate or layer formed principally of silicon or silicon carbide through the use of a reactive gas plasma, wherein said reactive gas plasma is a hydrogen fluoride gas plasma from which oxygen and oxides have been removed.

2. A method according to claim 1, wherein said hydrogen fluoride gas plasma has a purity of more than 99 percent.

3. A method according to claim 1, wherein said etching is conducted at a pressure in the range of 0.05 to 3 Torr.

4. A method for etching a semiconductor substrate or layer formed principally of silicon or silicon carbide into a required pattern through the use of a reactive gas plasma, said method comprising the steps of:

forming on said semiconductor substrate or layer a mask layer of silicon oxide, silicon nitride, aluminum, chromium, nickel, cobalt, tantalum, tungsten or molydenum, or photoresist, said mask layer having an inverted pattern of said required pattern; and selectively etching away semiconductor substrate or layer through said mask layer using, as said reactive gas plasma, a hydrogen fluoride gas plasma from which oxygen and oxides have been removed.

5. A method according to claim 4, wherein said hydrogen fluoride gas plasma has a purity of more than 99 percent.

6. A method according to claim 4, wherein said etching is conducted at a pressure of 0.05 to 3 Torr.

* * * * *